(12) United States Patent
Koyanagi et al.

(10) Patent No.: US 10,658,220 B2
(45) Date of Patent: May 19, 2020

(54) DEVICE TRANSFERRING METHOD

(71) Applicant: DISCO CORPORATION, Tokyo (JP)

(72) Inventors: Tasuku Koyanagi, Tokyo (JP); Akihito Kawai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/289,929

(22) Filed: Mar. 1, 2019

(65) Prior Publication Data

US 2019/0273009 A1 Sep. 5, 2019

(30) Foreign Application Priority Data

Mar. 5, 2018 (JP) .................................. 2018-038844

(51) Int. Cl.

| H01L 21/683 | (2006.01) |
|---|---|
| H01L 21/78 | (2006.01) |
| H01L 21/304 | (2006.01) |
| B23K 26/57 | (2014.01) |
| H01S 5/02 | (2006.01) |
| H01L 33/00 | (2010.01) |

(52) U.S. Cl.
CPC .......... *H01L 21/6836* (2013.01); *B23K 26/57* (2015.10); *H01L 21/304* (2013.01); *H01L 21/78* (2013.01); *H01L 33/0079* (2013.01); *H01S 5/0217* (2013.01)

(58) Field of Classification Search
None
See application file for complete search history.

(56) References Cited

U.S. PATENT DOCUMENTS

| 9,018,080 B2* | 4/2015 | Furuta ..................... H01L 21/78 257/428 |
|---|---|---|
| 2015/0348821 A1* | 12/2015 | Iwanaga ................. H01L 24/27 257/798 |
| 2018/0005862 A1* | 1/2018 | Priewasser ........ H01L 21/67132 |
| 2019/0348588 A1* | 11/2019 | Hsieh .................. H01L 25/0753 |

FOREIGN PATENT DOCUMENTS

| JP | 10305420 A | 11/1998 |
|---|---|---|
| JP | 2004072052 A | 3/2004 |

* cited by examiner

*Primary Examiner* — Angel Roman
(74) *Attorney, Agent, or Firm* — Greer Burns & Crain Ltd.

(57) ABSTRACT

A device transferring method for transferring a plurality of devices to a mounting substrate provided with a plurality of electrodes includes: a step of adhering an expandable tape to the plurality of devices formed on a front surface side of a substrate through a buffer layer; a step of applying a laser beam to the buffer layer from a back surface side of the substrate, to break the buffer layer; a step of moving the tape in a direction for spacing away from the substrate to separate the substrate and the plurality of devices from each other, thereby transferring the plurality of devices to the tape; a step of expanding the tape in such a manner that the layout of the plurality of devices corresponds to the layout of the plurality of electrodes; and a step of bonding the plurality of devices to the plurality of electrodes at once.

4 Claims, 11 Drawing Sheets

DEVICE TRANSFERRING METHOD

BACKGROUND OF THE INVENTION

Field of the Invention

The present invention relates to a device transferring method for transferring a plurality of devices from a wafer to a mounting substrate.

Description of the Related Art

Where a wafer formed with a plurality of devices is divided along division lines (streets), a plurality of device chips each including the device are thereby obtained. The division of the wafer is carried out using, for example, a cutting apparatus, a laser processing apparatus or the like. In the technique using the laser processing apparatus, a laser beam of such a wavelength as to be absorbed in the wafer is applied along the division lines, to evaporate the wafer, thereby dividing the wafer. Japanese Patent Laid-Open No. Hei 10-305420 discloses a technique in which a laser beam oscillated in a pulsed form is applied along division lines to form grooves in the wafer, and the wafer is divided along the grooves. Then, the device chips obtained by the division of the wafer are mounted onto a mounting substrate, whereby a desired package substrate is produced. Examples of the device to be formed on the wafer include an optical device such as a light emitting diode (LED). For example, where an n-type semiconductor layer and a p-type semiconductor layer forming a pn junction are epitaxially grown over a substrate formed of sapphire or SiC, an optical device can be formed thereby.

In addition, for transferring optical devices from a wafer to a mounting substrate, there is known a technique of separating the optical devices from the wafer without dividing the wafer. Japanese Patent Laid-open No. 2004-72052 discloses a technique in which after a semiconductor film for constituting optical devices is formed on a front surface of a wafer, a laser beam is applied from the back surface side of the wafer to form a modified layer in the vicinity of the interface between the wafer and the semiconductor layer, and the wafer and the semiconductor layer are separated from each other at the modified layer.

SUMMARY OF THE INVENTION

At the time of mounting the devices to the mounting substrate as above-mentioned, it is necessary to transfer the devices formed on the wafer to the mounting substrate. The transfer of the devices is carried out, for example, by repeating an operation of picking up the device from the wafer, transferring the device onto the mounting substrate and die-bonding the device to a predetermined position on the mounting substrate, for each of the devices. In this case, a long-time transferring operation is needed for mounting all the devices onto the mounting substrate, so that productivity is lowered.

The present invention has been made in consideration of such a problem. It is therefore an object of the present invention to provide a device transferring method by which devices can be efficiently transferred from a wafer to a mounting substrate.

In accordance with an aspect of the present invention, there is provided a device transferring method for transferring a plurality of devices to a mounting substrate provided with a plurality of electrodes, the device transferring method including: a tape adhering step of adhering an expandable tape to the plurality of devices formed on a front surface side of a substrate through a buffer layer; a buffer layer breaking step of applying a laser beam of such a wavelength as to be transmitted through the substrate and to be absorbed in the buffer layer to the buffer layer from a back surface side of the substrate, to break the buffer layer, after the tape adhering step is performed; a transfer step of moving the tape in a direction for spacing away from the substrate to separate the substrate and the plurality of devices from each other, thereby transferring the plurality of devices having been formed on the substrate to the tape, after the buffer layer breaking step is performed; a tape expanding step of expanding the tape in such a manner that a layout of the plurality of devices adhered to the tape corresponds to a layout of the plurality of electrodes, after the transfer step is performed; and a die bonding step of bonding the plurality of devices adhered to the expanded tape to the plurality of electrodes at once, after the tape expanding step is performed.

Preferably, the device is an LED. In addition, preferably, the device transferring method further includes a step of exposing those surfaces of the devices which make contact with the tape, before or after the tape expanding step is performed. Besides, preferably, the tape includes a pressure sensitive adhesive including an ultraviolet (UV) curing resin, and the device transferring method further includes a step of applying UV rays to the tape to cure the pressure sensitive adhesive, after the tape expanding step is performed.

In the device transferring method according to the described aspect of the present invention, first, the plurality of devices formed on the wafer are transferred to the expandable tape. Then, the expandable tape is expanded, whereby the layout of the plurality of devices is made to correspond to the layout of the mounting positions of the devices on the mounting substrate, after which the plurality of devices are transferred to the mounting substrate at once. By this, the devices can be efficiently transferred from the wafer to the mounting substrate.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
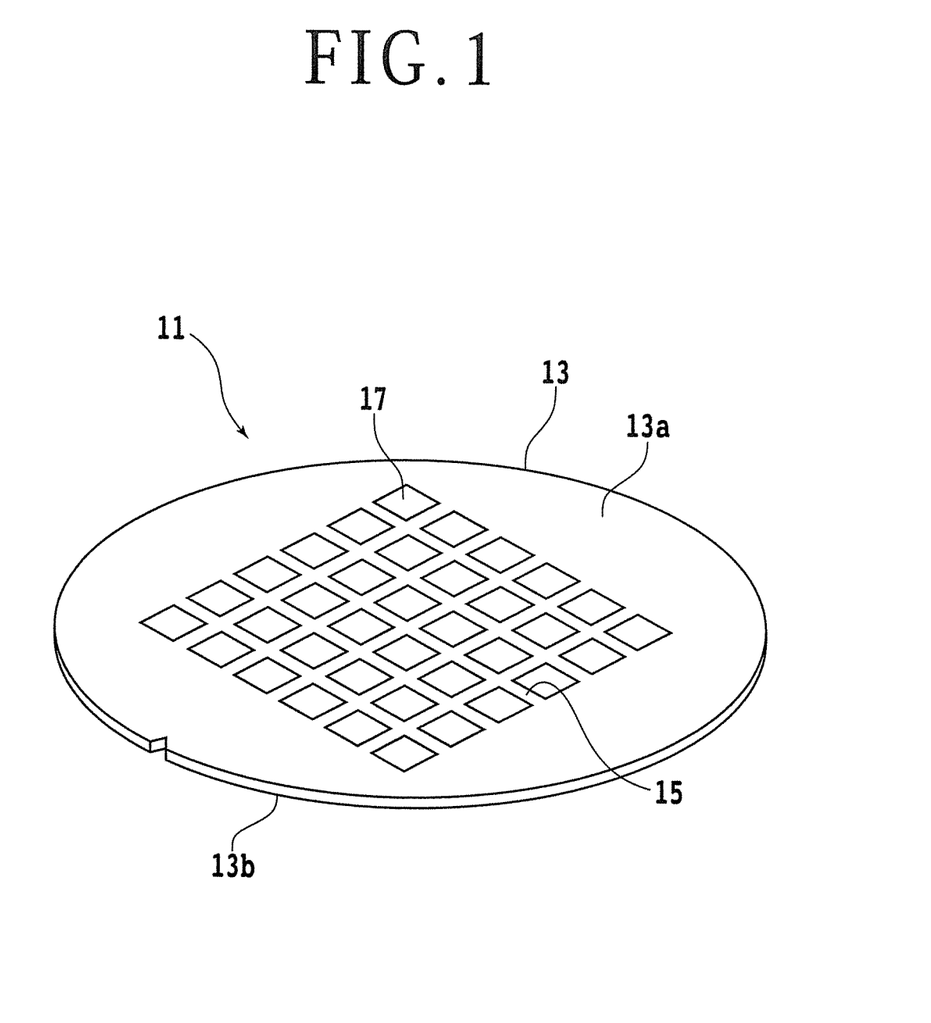
FIG. 1 is a perspective view depicting a configuration example of a wafer.

An embodiment of the present invention will be described below, referring to the attached drawings. FIG. 1 is a perspective view depicting a configuration example of a wafer 11 according to the present embodiment.

The wafer 11 is provided with a disk-shaped substrate 13 having a front surface 13a and a back surface 13b. The substrate 13 is partitioned into a plurality of regions by a plurality of division lines (streets) 15 arranged in a grid pattern, and devices 17 including integrated circuits (ICs), LEDs or the like are formed respectively on the front surface 13a side of the plurality of regions. The material, shape, structure, size and the like of the substrate 13 are not particularly limited. For example, semiconductor substrates (silicon substrate, SiC substrate, GaAs substrate, InP substrate, GaN substrate, etc.), sapphire substrates, ceramic substrates, resin substrates, metallic substrates and the like can be used as the substrate 13. In addition, the kind, number, shape, structure, size, layout and the like of the devices 17 are also not particularly limited.

Figure 2:
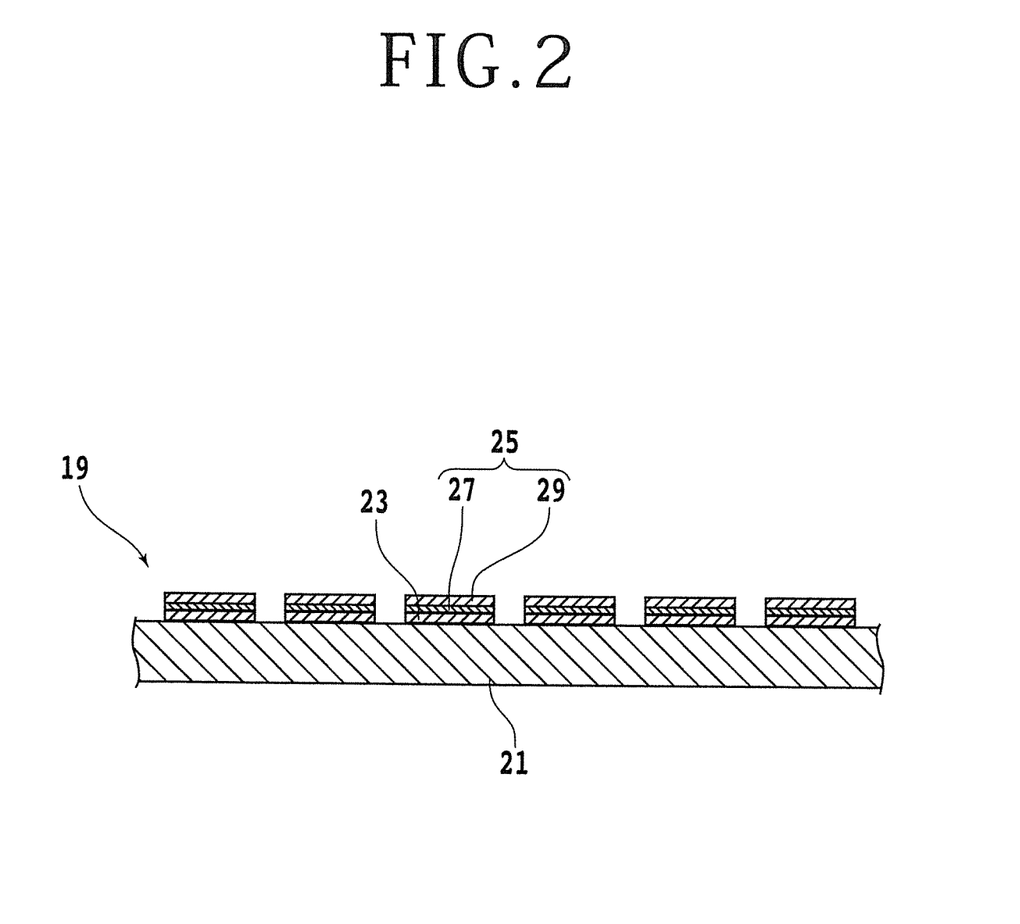
FIG. 2 is a sectional view depicting a configuration example of an optical device wafer.

An example of a more specific configuration of the wafer 11 is illustrated in FIG. 2. FIG. 2 is a sectional view depicting a configuration example of an optical device wafer 19 in which optical devices 25 are formed over a substrate 21 through a buffer layer 23. A plurality of optical devices 25 are formed over the substrate 21 through a plurality of buffers 23. Each of the optical devices 25 has a p-type semiconductor layer 27 formed of a p-type semiconductor in which holes are majority carriers, and an n-type semiconductor layer 29 formed of an n-type semiconductor in which electrons are majority carriers. The p-type semiconductor layer 27 and the n-type semiconductor layer 29 form a pn junction, whereby the optical device 25 capable of emitting light through recombination of holes and electrons is obtained.

The buffer layer 23 is configured by a layer that has a function to restrain the generation of defects due to lattice mismatch between the substrate 21 and the p-type semiconductor layer 27, for example. The material of the buffer layer 23 is appropriately selected according to the lattice constants of the substrate 21 and the lattice constants of the p-type semiconductor layer 27. In addition, the buffer layer 23 is a layer to be broken by application of a laser beam in a buffer layer breaking step which will be described later, and it functions also as a separation layer for separation between the substrate 21 and the optical devices 25.

The materials of the buffer layer 23, the p-type semiconductor layer 27 and the n-type semiconductor layer 29 are not limited, and any material may be freely selected insofar as the optical devices 25 can be formed on the substrate 21. For example, by using a sapphire substrate, an SiC substrate or the like as the substrate 21, the buffer layer 23 including GaN, the p-type semiconductor layer 27 including p-type GaN and the n-type semiconductor layer 29 including n-type GaN can sequentially be formed over the substrate 21 by epitaxial growth. For forming each of the layers, there can be used, for example, a metal organic chemical vapor deposition (MOCVD) method, a molecular beam epitaxy (MBE) method and the like. Note that while the optical device 25 including the p-type semiconductor layer 27 and the n-type semiconductor layer 29 has been depicted in FIG. 2, the configuration of the optical device 25 is not restricted to this one. For instance, an optical device 25 which includes a light emitting layer between a p-type semiconductor layer 27 and an n-type semiconductor layer 29 and in which light is emitted from the light emitting layer can also be used.

In the case of producing a package substrate by use of the devices 17 (see FIG. 1) represented by the above-mentioned optical devices 25, it is necessary to transfer the devices 17 from the wafer 11 onto a mounting substrate. While this transfer can be carried out, for example, by picking up the devices 17 formed on the substrate 13 and die-bonding them to predetermined positions of the mounting substrate, one after another, this technique needs huge working time for transferring the devices 17. In the device transferring method according to the present embodiment, first, the plurality of devices 17 formed on the substrate 13 are transferred onto a tape whose shape can be expanded by an external force (an expandable tape). Then, the expandable tape is expanded to cause the layout of the plurality of devices 17 to correspond to the layout of the mounting positions of the devices on the mounting substrate, after which the plurality of devices 17 are transferred onto the mounting substrate at once. By this, the devices 17 can be efficiently transferred from the wafer 11 onto the mounting substrate.

Figure 3:
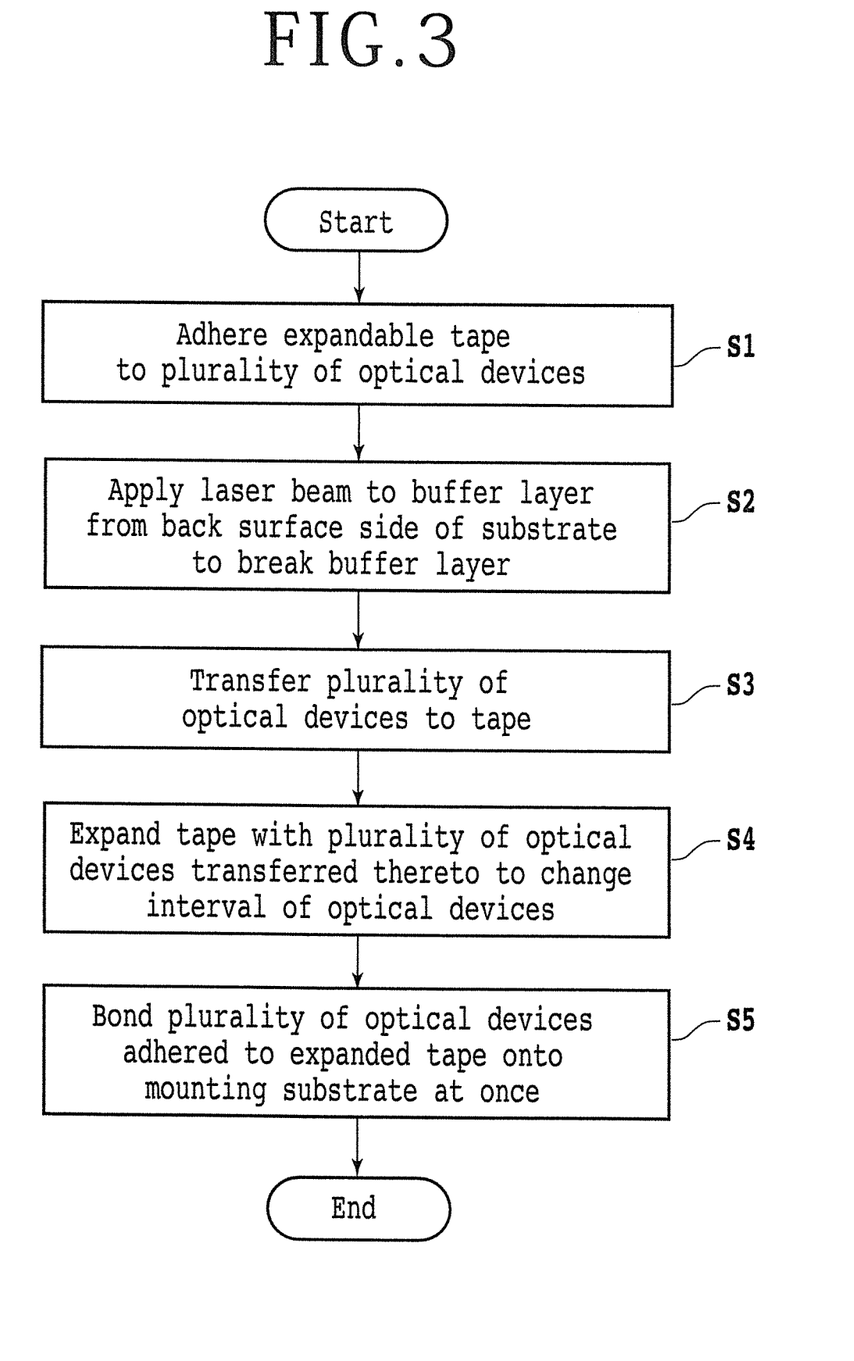
FIG. 3 is a flow chart depicting an example of a device transferring method.

FIG. 3 is a flow chart depicting an example of the device transferring method according to the present embodiment. The device transferring method according to the present embodiment will be described below, referring to FIG. 3. Note that a case in which the optical devices 25 are separated from the optical device wafer 19 (see FIG. 2) and transferred onto a mounting substrate will be particularly described as an example.

Figure 4:
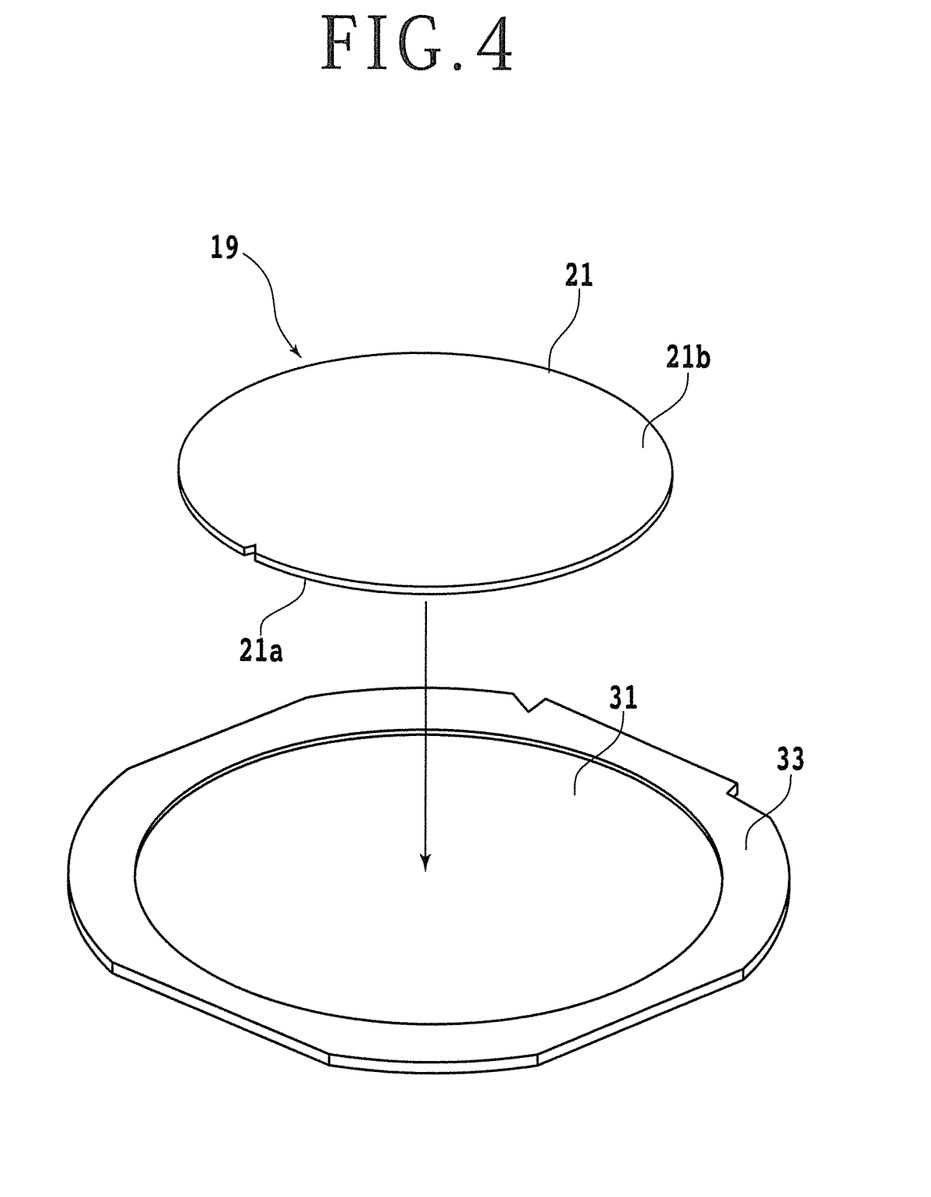
FIG. 4 is a perspective view depicting a manner in which the optical device wafer is adhered to a tape.

First, a tape adhering step S1 of adhering an expandable tape to a plurality of optical devices 25 formed on a substrate 21 is performed. FIG. 4 is a perspective view depicting a manner in which the optical device wafer 19 is adhered to a tape 31. The plurality of optical devices 25 (see FIG. 2) are formed on a front surface 21a side of the disk-shaped substrate 21. In addition, the tape 31 is a tape capable of being expanded (extended) by an external force (an expandable tape). An annular frame 33 is adhered to an outer peripheral portion of the tape 31, and the plurality of optical devices 25 formed on the front surface 21a side of the substrate 21 are adhered to the tape 31. By this, the optical device wafer 19 is supported by the frame 33 in the state in which a back surface 21b side of the substrate 21 is exposed to the upper side. The material of the tape 31 is not limited, insofar as it is expandable and it can be adhered to the plurality of optical devices 25. A pressure sensitive adhesive of the tape 31 is preferably a material having a property of being lowered in pressure sensitive adhesive force by an external stimulus such as light or heat. For instance, a UV-curing resin can be used as the pressure sensitive adhesive of the tape 31.

Next, a buffer layer breaking step S2 of applying a laser beam to the buffer layer 23 from the back surface 21b side of the substrate 21 to break the buffer layer 23 is performed. In the buffer layer breaking step S2, first, the optical device wafer 19 is supported by a laser processing apparatus.

Figure 5:
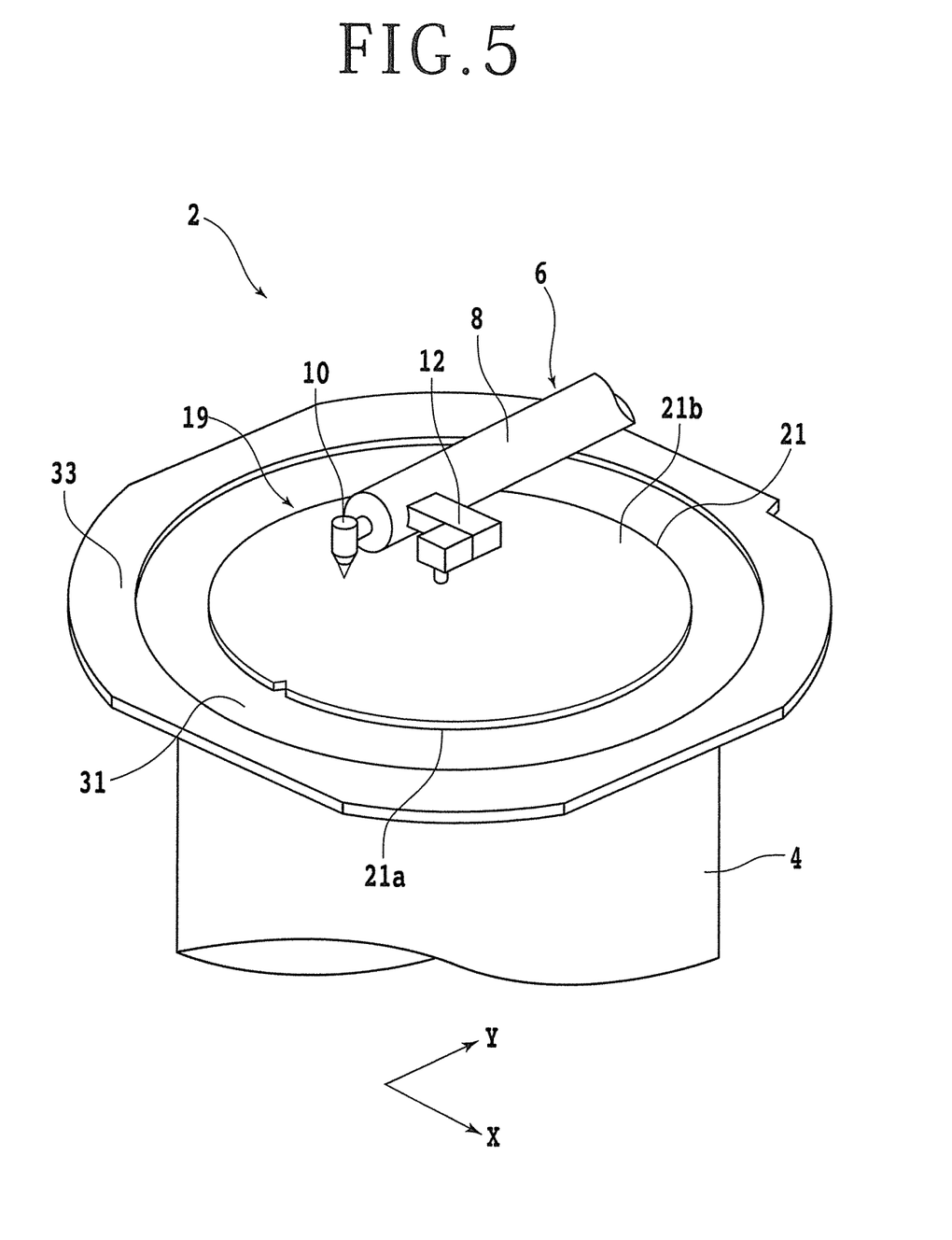
FIG. 5 is a perspective view depicting schematically a state in which the optical device wafer is supported by a laser processing apparatus.

FIG. 5 is a perspective view depicting schematically a state in which the optical device wafer 19 is supported by a laser processing apparatus 2. The laser processing apparatus 2 includes a chuck table 4 for holding the optical device wafer 19, and a laser processing unit 6 capable of applying a laser beam of such a wavelength as to be transmitted through the substrate 21 of the optical device wafer 19 and to be absorbed in the buffer layer 23.

The chuck table 4 suction holds the optical device wafer 19 through the tape 31. Specifically, an upper surface of the chuck table 4 is a holding surface for holding the optical device wafer 19, and the holding surface is connected to a suction source (not depicted) through a suction passage (not depicted) formed inside the chuck table 4. In a state in which the frame 33 is fixed by clamps 14 (see FIG. 6) provided in the laser processing apparatus 2 and the optical device wafer 19 is supported by the holding surface of the chuck table 4, a negative pressure of the suction source is caused to act at the holding surface, whereby the optical device wafer 19 is suction held by the chuck table 4. In addition, the chuck table 4 is moved in a processing feeding direction (X-axis direction) and an indexing feeding direction (Y-axis direction) by a moving mechanism (not depicted). The optical device wafer 19 is suction held by the chuck table 4 in such a manner that the back surface 21b of the substrate 21 is exposed to the upper side. In this state, a laser beam is applied from the laser processing unit 6 toward the optical device wafer 19.

The laser processing unit 6 has a cylindrical casing 8. A focusing unit 10 for focusing a pulsed laser beam oscillated from a pulsed laser beam oscillator (not depicted) such as a yttrium aluminum garnet (YAG) laser oscillator or a yttrium orthovanadate ($YVO_4$) laser oscillator provided in the laser processing apparatus 2 is attached to a tip portion of the casing 8. Further, imaging means 12 for imaging an application region of the laser beam is attached to the casing 8. An image picked up by the imaging means 12 is used for image processing such as pattern matching conducted for alignment between the focusing unit 10 and the optical device wafer 19. By this, the application position of the laser beam can be controlled.

At the time of applying the laser beam to the buffer layer 23 (see FIG. 2) formed on the front surface 21a side of the substrate 21, the chuck table 4 is moved to a position beneath the focusing unit 10, and the laser beam of such a wavelength as to be transmitted through the substrate 21 and to be absorbed in the buffer layer 23 is focused by the focusing unit 10 and applied to the buffer layer 23. Note that the intensity of the laser beam is set in such a manner as to make it possible to break the buffer layer 23.

Figure 6:
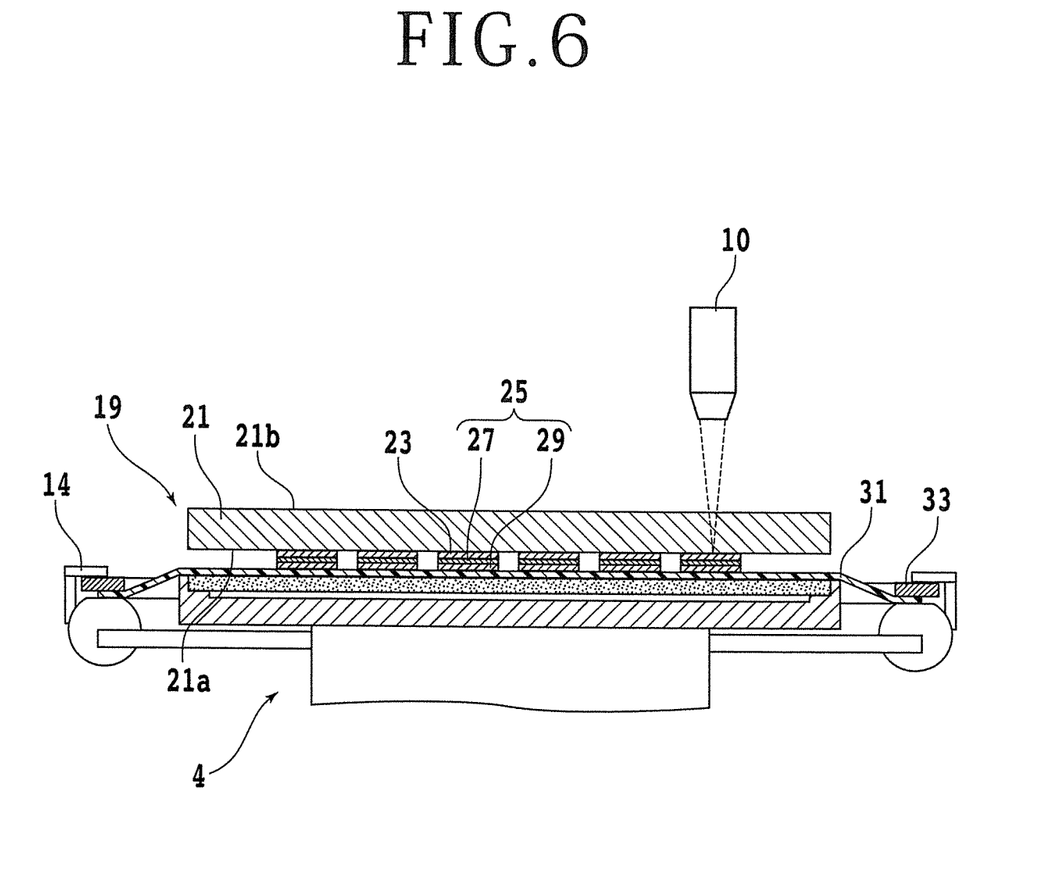
FIG. 6 is a sectional view depicting a manner in which a laser beam is applied to a buffer layer.

FIG. 6 is a sectional view depicting a manner in which the laser beam is applied to the buffer layer 23. The plurality of optical devices 25 formed on the front surface 21a side of the substrate 21 are adhered to the tape 31. In addition, the frame 33 is fixed by the clamps 14, and the optical device wafer 19 is suction held by the chuck table 4 in such a manner that the back surface 21b side of the substrate 21 is exposed to the upper side. When the laser beam is applied to the optical device wafer 19, the laser beam is transmitted through the substrate 21 and absorbed in the buffer layer 23, whereby the buffer layer 23 is broken. Note that it is unnecessary to completely separate the substrate 21 and the buffer layer 23 from each other by the application of the laser beam; specifically, it is sufficient that the buffer layer 23 is broken to such an extent that the substrate 21 and the buffer layer 23 can be separated from each other when the tape 31 is peeled off from the optical device wafer 19 in a later step.

Subsequently, a transfer step S3 of separating the substrate 21 and the optical devices 25 from each other to thereby transfer the plurality of optical devices 25 formed on the front surface 21a side of the substrate 21 onto the tape 31 is performed. In the transfer step S3, the tape 31 adhered to the optical device wafer 19 is peeled off. Specifically, the tape 31 is moved in a direction for spacing away from the substrate 21. In this instance, the buffer layer 23 provided between the substrate 21 and the optical devices 25 has been broken in the buffer layer breaking step S2, and the joint between the substrate 21 and the optical devices 25 has been weakened. Therefore, when the tape 31 is moved, the optical devices 25 are separated from the substrate 21, following up to the tape 31. Note that at the time of peeling off the tape 31 from the optical device wafer 19, a peeling member such as a cutting tool may be inserted between the substrate 21 and the optical device 25, to promote the separation of the substrate 21 and the optical device 25 from each other. By this, the optical devices 25 can be separated from the substrate 21, even if the breakage of the buffer layer 23 in the buffer layer breaking step S2 is insufficient.

Figure 7A:
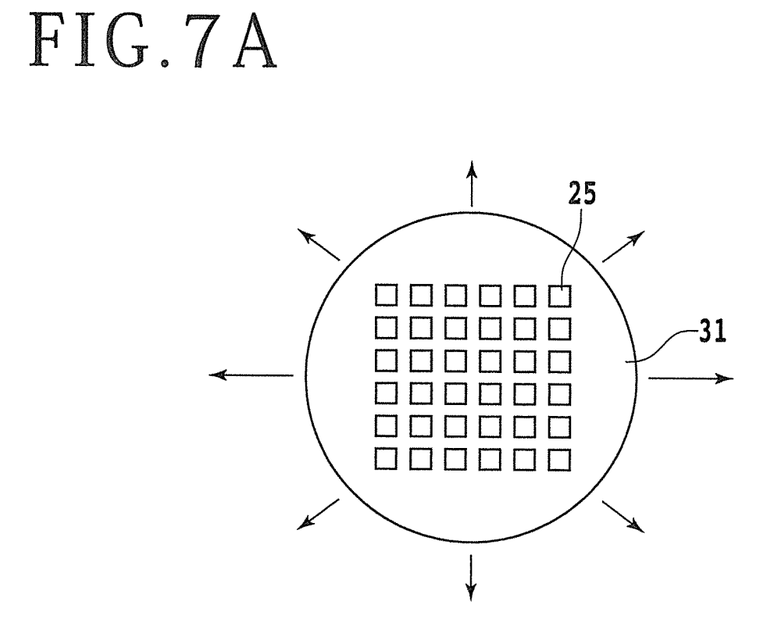
FIG. 7A is a plan view depicting a manner in which the tape is expanded.
Figure 7B:
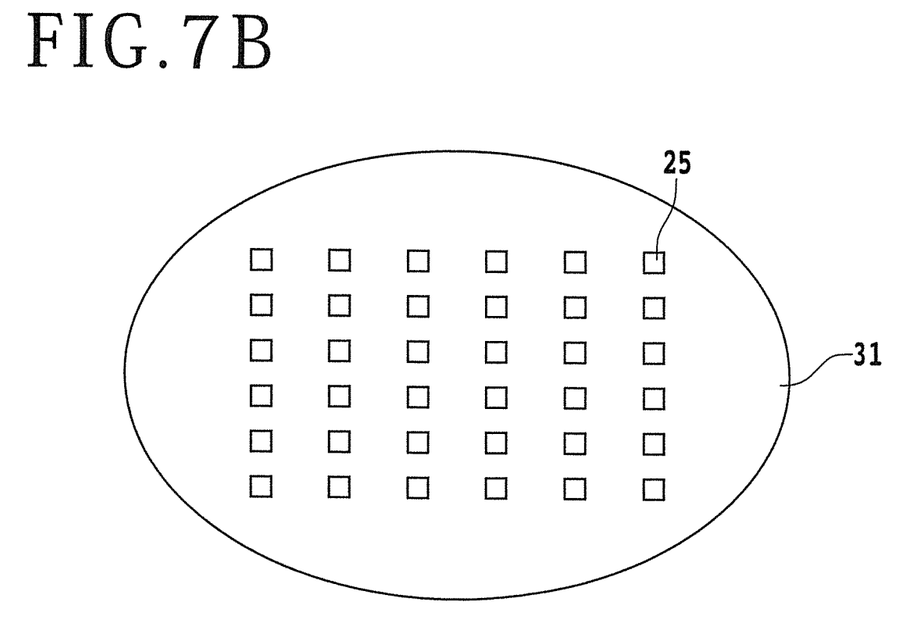
FIG. 7B is a plan view depicting the tape after expanded.

Next, a tape expanding step S4 of expanding the tape 31, to which the plurality of optical devices 25 have been transferred, to change the interval of the optical devices 25 is performed. FIG. 7A is a plan view depicting a manner in which the tape 31 with the plurality of optical devices 25 adhered thereto is expanded. Since the tape 31 is expandable, it can be expanded by exerting an external force thereon. When the tape 31 is expanded, the distance between the adjacent optical devices 25 is enlarged, whereby the layout of the plurality of optical devices 25 is changed. FIG. 7B is a plan view depicting the tape 31 after expanded. As illustrated in FIG. 7B, when the tape 31 is expanded, the interval of the optical device 25 is widened according to the amount of expansion of the tape 31.

The plurality of optical devices 25 adhered to the tape 31 are mounted in a predetermined layout onto the mounting substrate in a later step. In view of this, in the tape expanding step S4, the tape 31 is expanded in such a manner that the layout of the optical devices 25 adhered to the tape 31 corresponds to the layout of the optical devices 25 on the mounting substrate. For instance, in the case where the plurality of optical devices 25 adhered to the tape 31 are to be connected to a plurality of electrodes provided in a predetermined layout on the mounting substrate, the tape 31 is expanded in such a manner that the layout of the optical devices 25 adhered to the tape 31 corresponds to the layout of the plurality of electrodes. Note that the expression "the layout of the plurality of optical devices 25 corresponds to the layout of the plurality of electrodes" refers to a state in which the plurality of optical devices 25 are laid out at such an interval that they can be connected respectively to desired electrodes. For example, it is sufficient to expand the tape 31 in such a manner that the interval of the plurality of optical devices 25 adhered to the tape 31 will be substantially the same as the interval of the plurality of electrodes formed on the mounting substrate.

The method for expanding the tape 31 is not limited, and the expansion can be carried out by use of an exclusive-use expanding apparatus or the like. For example, the expansion can be carried out by use of an expanding apparatus which includes a support unit for supporting an outer peripheral portion of the tape 31, and a contact portion to be brought into contact with the side of the back surface (the surface on which the optical devices 25 are not formed) of the tape 31. In this case, in a state in which the outer peripheral portion of the tape 31 is supported by the support unit, a central portion on the back surface side of the tape 31 is brought into contact with the contact portion, and the contact portion is relatively moved from the back surface side toward the front surface side of the tape 31, whereby the tape 31 can be expanded. Note that a manner in which the tape 31 is expanded with the frame 33 (see FIG. 4, etc.) detached from the tape 31 is illustrated in FIGS. 7A and 7B, but the expansion of the tape 31 may be conducted with the frame 33 adhered to the tape 31. For example, the expansion of the tape 31 can be carried out in a state in which the frame 33 adhered to the tape 31 is supported by the support unit of the above-mentioned expanding apparatus.

After the tape expanding step S4, a treatment for lowering the pressure sensitive adhesive force of the tape 31 is preferably performed, to thereby facilitate the peeling of the optical devices 25 from the tape 31 in a later step. For instance, in the case where the pressure sensitive adhesive of the tape 31 is a UV curing resin, the pressure sensitive adhesive force of the tape 31 can be lowered by performing a step of applying UV rays to the tape 31 to thereby cure the pressure sensitive adhesive of the tape 31.

Subsequently, a die bonding step S5 of transferring, and bonding, the plurality of optical devices 25 adhered to the expanded tape 31 onto the mounting substrate at once is performed. In the die bonding step S5, the plurality of optical devices 25 adhered to the tape 31 are transferred and mounted onto the mounting substrate while maintaining the layout of the plurality of optical devices 25. Therefore, it is unnecessary to perform the alignment between the plurality of optical devices 25 and the mounting substrate on the basis of each optical device 25, and the devices can be efficiently transferred from the tape 31 onto the mounting substrate. The method for transferring the plurality of optical devices 25 onto the mounting substrate is not particularly limited. For instance, a transfer unit by which the plurality of optical devices 25 are picked up from the tape 31 and transferred onto the mounting substrate at once may be used, or the plurality of optical devices 25 may be transferred onto the mounting substrate by adhering the tape 31 directly to the mounting substrate.

Figure 8:
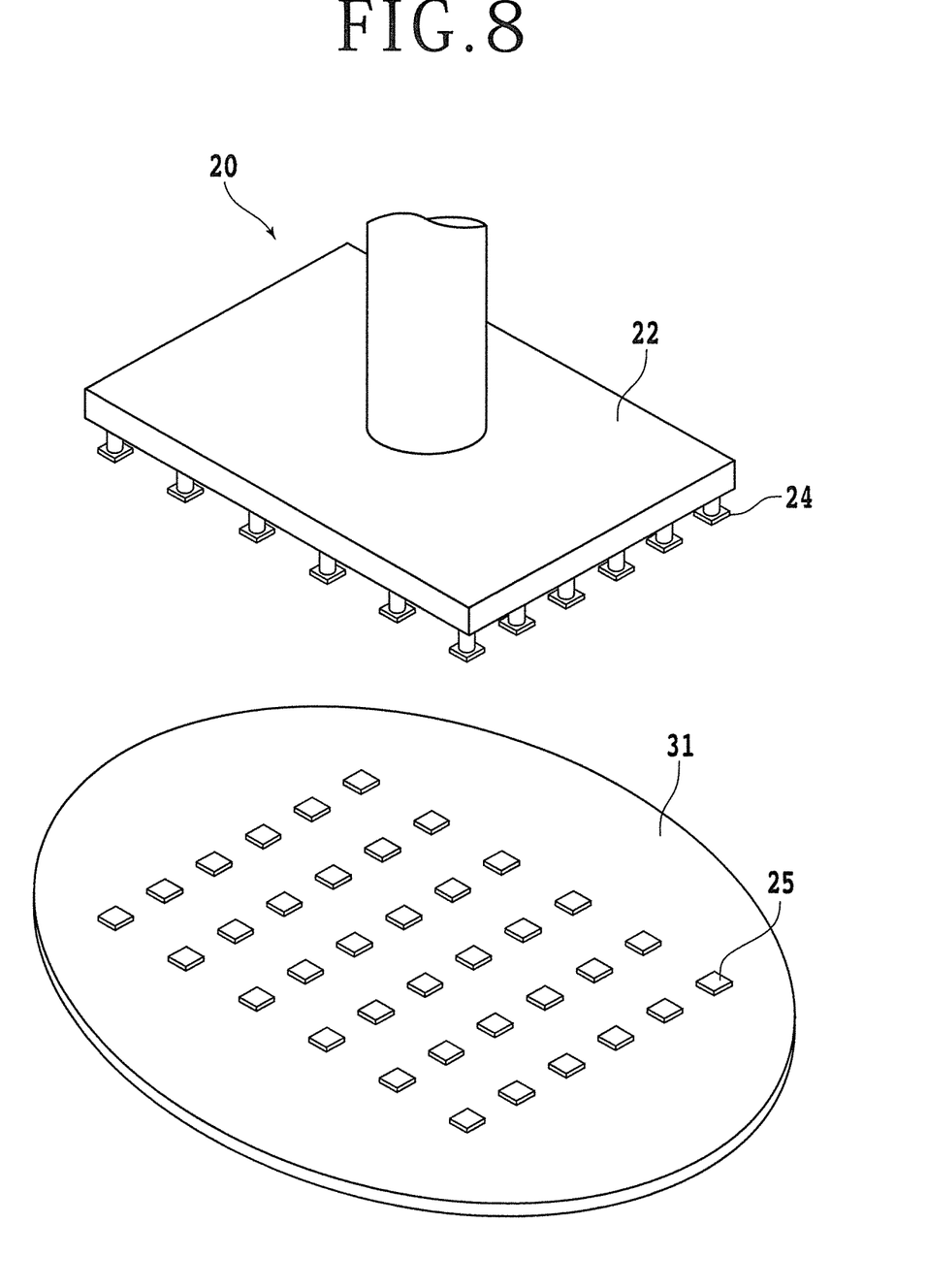
FIG. 8 is a perspective view depicting a manner in which a plurality of optical devices are held by a transfer unit.
Figure 9:
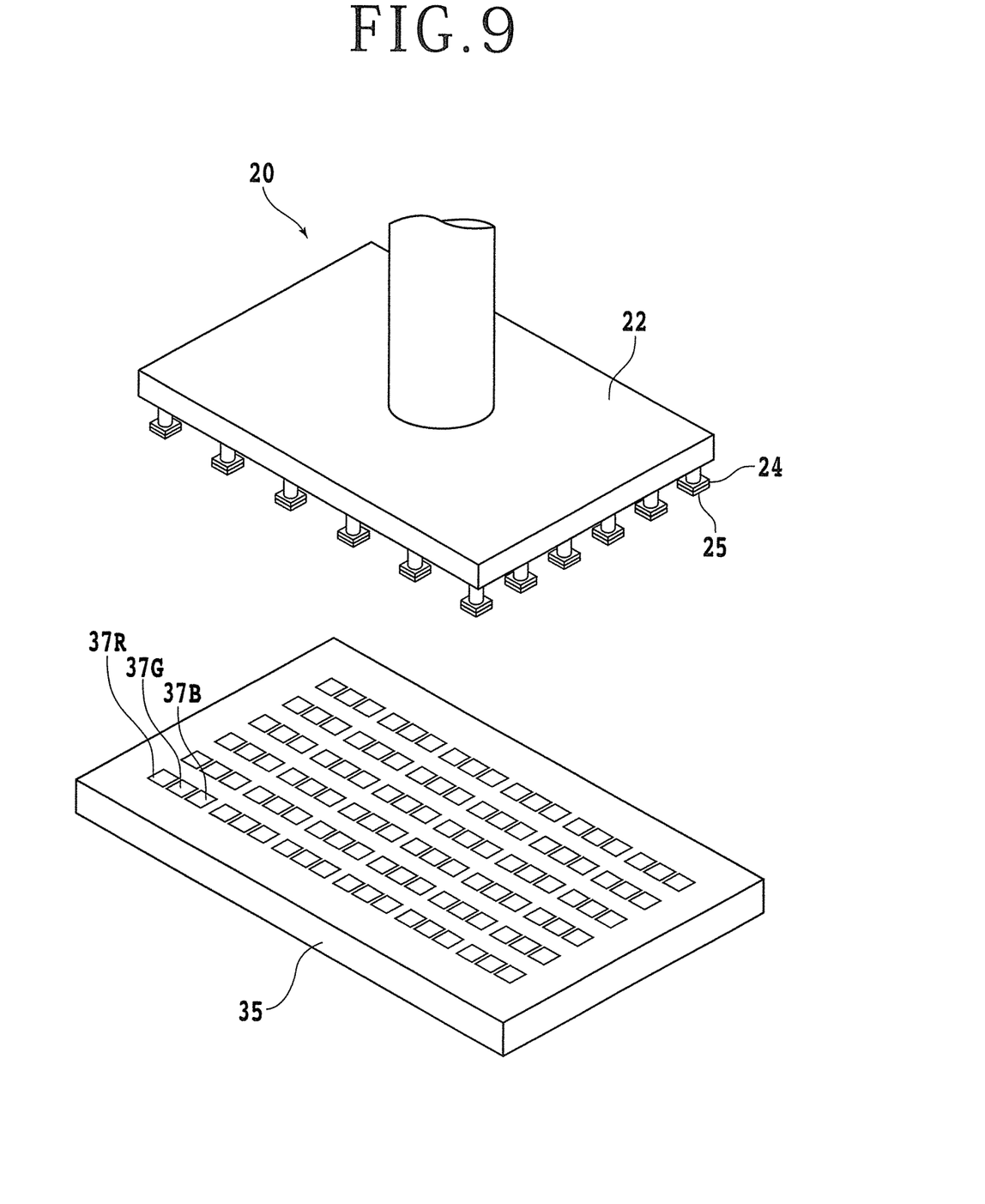
FIG. 9 is a perspective view depicting a manner in which the plurality of optical devices are disposed on a mounting substrate by the transfer unit.

The method of transferring the plurality of optical devices 25 onto the mounting substrate by a transfer unit will be described referring to FIGS. 8 and 9. FIG. 8 is a perspective view depicting a manner in which a plurality of optical devices 25 are held by a transfer unit 20. The transfer unit 20 includes a plate-shaped base 22, and a plurality of suction pads 24 that are provided on a lower surface side of the base 22 and that suction hold the optical devices 25.

First, the tape 31 is held horizontally such that the plurality of optical devices 25 are exposed to the upper side, and the transfer unit 20 is disposed on an upper side of the tape 31. Then, the transfer unit 20 is moved vertically downward, to bring the plurality of suction pads 24 into contact with the optical devices 25, respectively. In this state, the plurality of optical devices 25 are suction held by the plurality of suction pads 24, whereby the plurality of optical devices 25 are held by the transfer unit 20. Thereafter, with the tape 31 maintained in situ, the transfer unit 20 is moved vertically upward, whereby the plurality of optical devices 25 are peeled off from the tape 31, and are picked up by the transfer unit 20. As a result, those surfaces of the optical devices 25 which have been in contact with the tape 31 are exposed. The plurality of suction pads 24 are laid out such as to correspond to the layout of the plurality of optical devices 25 adhered to the tape 31. Specifically, the interval of the plurality of suction pads 24 is substantially coincident with the interval of the plurality of optical devices 25 adhered to the tape 31. By use of the transfer unit 20, therefore, the plurality of optical devices 25 can be picked up at once.

Thereafter, the transfer unit 20 is moved onto the mounting substrate which is the destination for the plurality of optical devices 25 to be transferred. FIG. 9 is a perspective view depicting a manner in which the plurality of optical devices 25 are disposed on a mounting substrate 35 by the transfer unit 20. The mounting substrate 35 is formed with a plurality of electrodes to which the optical devices 25 are to be connected respectively. Here, an example is depicted in which the optical devices 25 are red LEDs, whereas the mounting substrate 35 is formed with a plurality of electrodes 37R to be connected with the red LEDs, a plurality of electrodes 37G to be connected with green LEDs, and a plurality of electrodes 37B to be connected with blue LEDs.

First, the mounting substrate 35 is disposed at a predetermined position, and an adhesive such as a silver paste is applied onto the plurality of electrodes 37R. Then, the transfer unit 20 is positioned in such a manner that the suction pads 24 are disposed respectively on the upper side of the plurality of electrodes 37R. Thereafter, the transfer unit 20 is moved vertically downward, whereby those surfaces of the plurality of optical devices 25 which have been in contact with the tape 31 are connected respectively to the electrodes 37R through the adhesive. In this way, the plurality of optical devices 25 are bonded to the mounting substrate 35. Note that the plurality of suction pads 24 are provided in such a manner that the layout thereof corresponds to the layout of the plurality of electrodes 37R. By use of the transfer unit 20, therefore, the plurality of optical devices 25 can be bonded to the mounting substrate 35 at once.

Figure 10:
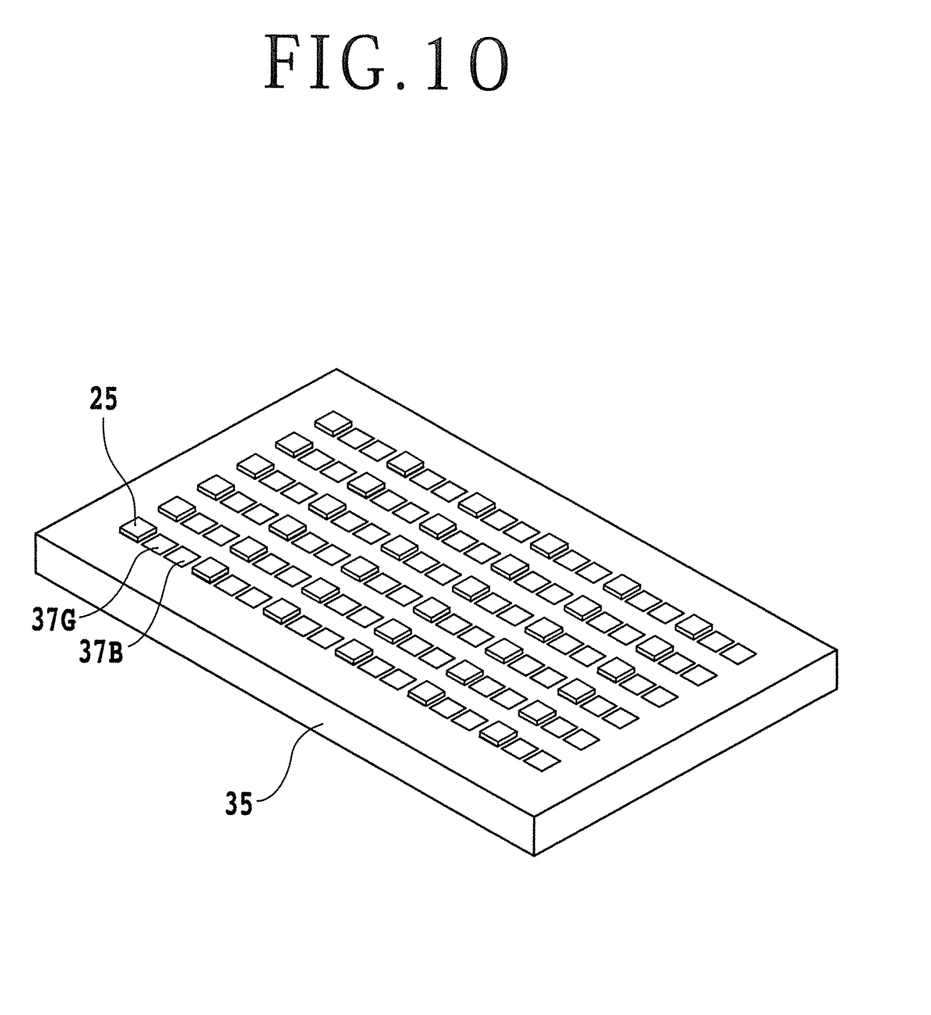
FIG. 10 is a perspective view depicting the mounting substrate to which the plurality of optical devices are bonded.

FIG. 10 is a perspective view depicting the mounting substrate 35 to which a plurality of optical devices 25 are bonded. The optical devices 25 which are the red LEDs are bonded respectively to the plurality of electrodes 37R (see FIG. 9) provided on the mounting substrate 35. Then, a step of bonding green LEDs respectively to the plurality of electrodes 37G at once and a step of bonding blue LEDs respectively to the plurality of electrodes 37B at once are performed, whereby an LED package in which the LEDs for three colors are mounted can be produced.

Note that in the case of transferring the optical devices 25 by use of the transfer unit 20, the side of those surfaces (back surfaces) of the optical device 25 which have been in contact with the tape 31 is connected to the electrodes, but the side of those surface (front surfaces) of the optical devices 25 which have not been in contact with the tape 31 may also be connected to the electrodes. An example of the method of connecting the front surface side of the optical devices 25 to the electrodes formed on the mounting substrate 35 is illustrated in FIG. 11.

Figure 11:
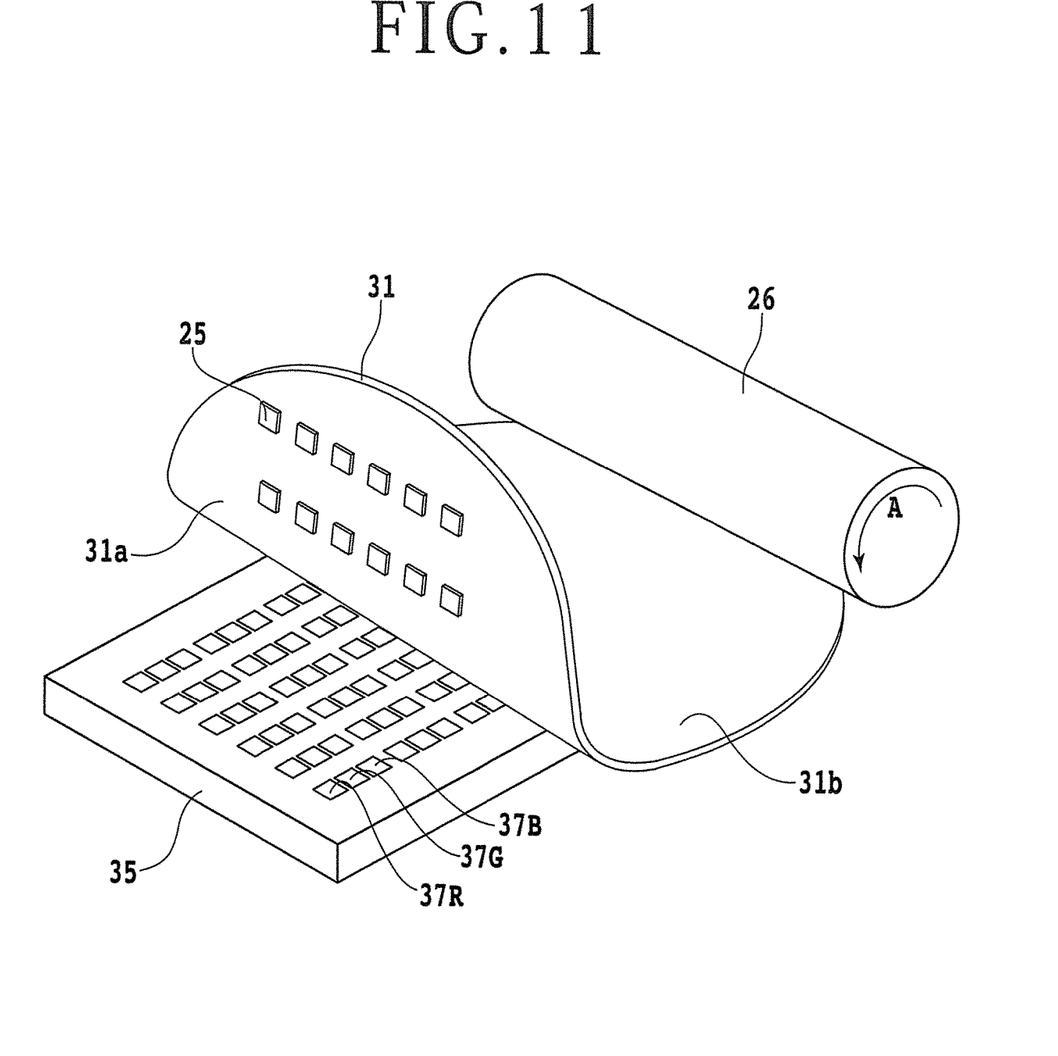
FIG. 11 is a perspective view depicting a manner in which the plurality of optical devices are mounted onto the mounting substrate by use of a roller.

FIG. 11 is a perspective view depicting a manner in which a plurality of optical devices 25 are mounted onto a mounting substrate 35 by use of a roller 26. At the time of mounting the plurality of optical devices 25 onto the mounting substrate 35 by use of the roller 26, first, the mounting substrate 35 is disposed at a predetermined position, an adhesive such as a silver paste is applied to the electrodes formed on the mounting substrate 35, and a front surface 31a (a surface on which the plurality of optical devices 25 are formed) of the expanded tape 31 and the surface formed with the electrodes of the mounting substrate 35 are made to face each other. In this instance, the tape 31 and the mounting substrate 35 are positioned in such a manner that the plurality of optical devices 25 are respectively disposed on the upper side of the plurality of electrodes (in FIG. 11, electrodes 37R). Thereafter, the roller 26 is rotated in a direction indicated by arrow A, and a back surface 31b (a surface on which the optical devices 25 are not formed) of the tape 31 is pressed to the mounting substrate 35 side by the roller 26. By this, the plurality of optical devices 25 are respectively connected to the electrodes 37R through the adhesive, and are bonded to the mounting substrate 35.

Note that as the adhesive for adhering the electrodes 37R and the optical devices 25 to each other, an adhesive having an adhesive force higher than the adhesive force of the tape 31 is used. The aforementioned treatment for lowering the adhesive force of the tape 31 (application of UV rays or the like) ensures that the adhesive force required of the adhesive applied to the electrodes 37R is lowered, thereby making it possible to enhance the degree of freedom in selecting the material of the adhesive. Thereafter, the tape 31 is peeled off from the mounting substrate 35, whereby the plurality of optical devices 25 and the tape 31 are separated from each other, and a mounting substrate 35 with the plurality of optical devices 25 bonded thereto is obtained (see FIG. 10).

As above-mentioned, in the device transferring method according to the present embodiment, after the plurality of optical devices 25 are adhered to the expandable tape 31, the tape 31 is expanded, whereby the layout of the plurality of optical devices 25 can be controlled in such a manner that the layout of the plurality of optical devices 25 adhered to the tape 31 corresponds to the layout of the mounting positions of the optical devices 25 on the mounting substrate 35. By this, the plurality of optical devices 25 can be transferred onto the mounting substrate 35 at once, and the transfer of the devices can be performed efficiently. Particularly, at the time of producing, for example, LED packages in which a multiplicity of LEDs are arranged at predetermined periods on a mounting substrate, the efficiency of the device transferring work is largely enhanced if the plurality of devices formed on the same wafer can be disposed onto a mounting substrate at a predetermined interval and at once. For this reason, the device transferring method according to the present embodiment is especially useful for the case of, for example, transferring a plurality of LEDs onto a mounting substrate to produce LED packages. In addition, in the device transferring method according to the present embodiment, the expandable tape 31 is expanded to widen the interval of the plurality of optical devices 25, before picking up the devices. Therefore, breakage of the optical devices 25 due to contact between the optical devices 25 at the time of picking up can be prevented, and an enhanced yield can be realized.

Note that while an example in which all the optical devices 25 adhered to the tape 31 are transferred onto the mounting substrate 35 at once has been depicted in the above embodiment, all the optical devices 25 may be transferred by repeating the die bonding step S5 multiple times. In other words, an operation of transferring part of the plurality of optical devices 25 adhered to the tape 31 onto the mounting substrate 35 may be repeated plural times to thereby transfer all the optical devices 25. Besides, in the case of repeating the die bonding step S5 multiple times, the tape expanding step S4 may be again carried out after the die bonding step S5 is performed. In other words, after part of the plurality of optical devices 25 adhered to the tape 31 are transferred onto the mounting substrate 35 at once, the tape 31 may be expanded to again adjust the layout of the remaining optical devices 25, before performing the next transferring operation. Particularly, in the case where it is difficult to lay out all the optical devices 25 at desired positions by one-time expansion of the tape 31 due to the influence of, for example, variability of the amount of expansion of the tape 31, it is desirable to divisionally perform the transfer of the optical device 25 in multiple steps, while conducting the tape expanding step S4 each time, to adjust the layout of the optical devices 25. By this, the interval of the optical devices 25 can be controlled accurately, and the optical devices 25 can be easily arranged at desired positions on the mounting substrate 35.

In addition, at the time of adhering the optical devices 25 onto the mounting substrate 35, the adhesion surfaces of the optical devices 25 can be changed as required. Specifically, either of the side of the surfaces making contact with the tape 31 (back surfaces) and the side of the surfaces not making contact with the tape 31 (front surfaces) of the optical devices 25 depicted in FIG. 7B may be adhered to the mounting substrate 35. In the case of changing the adhesion surfaces of the optical devices 25, a step of altering the exposed surfaces of the optical devices 25 is conducted before the die bonding step S5. For example, by using the method illustrated in FIGS. 8 and 9, after the tape expanding step S4, the back surface side of the optical devices 25 can be exposed and the back surface side of the optical devices 25 can be adhered to the mounting substrate. In FIG. 9, the front surface side of the optical devices 25 is suction held by the suction pads 24, whereas the back surface side is exposed.

Besides, the back surface side of the optical devices 25 may be exposed by re-adhering the tape prior to the tape expanding step S4. Specifically, before the tape 31 with the plurality of optical devices 25 adhered thereto is expanded (see FIG. 7A), a re-adhering tape is adhered to the front surface side of the plurality of optical devices 25. Thereafter, the tape 31 is peeled off to separate the plurality of optical devices 25 and the tape 31 from each other, whereby the plurality of optical devices 25 are transferred onto the re-adhering tape, in the state in which their back surface side is exposed. In this case, the layout of the optical devices 25 is changed by expanding the re-adhering tape in the tape expanding step S4 to be conducted later, and, therefore, an expandable tape is used as the re-adhering tape. In addition, in the case of using the re-adhering tape, the tape 31 may not necessarily be expandable.

Besides, while the case where the optical devices 25 formed over the substrate 21 through the buffer layer 23 are transferred has been mainly described hereinabove, the kind of the devices to be transferred by the device transferring method according to the present embodiment is not restricted. In addition, the material of the buffer layer 23 also can be selected as required, insofar as the buffer layer 23 can be broken by the application of the laser beam in the buffer layer breaking step S2.

Other than the above-mentioned, the structures and the methods and the like according to the present embodiment can be appropriately modified in carrying out the present invention, without departing from the scope of the object of the invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A device transferring method for transferring a plurality of devices to a mounting substrate provided with a plurality of electrodes, the device transferring method comprising:
- a tape adhering step of adhering an expandable tape to the plurality of devices formed on a front surface side of a substrate through a buffer layer;
- a buffer layer breaking step of applying a laser beam of such a wavelength as to be transmitted through the substrate and to be absorbed in the buffer layer to the buffer layer from a back surface side of the substrate, to break the buffer layer, after the tape adhering step is performed;
- a transfer step of moving the tape in a direction for spacing away from the substrate to separate the substrate and the plurality of devices from each other, thereby transferring the plurality of devices having been formed on the substrate to the tape, after the buffer layer breaking step is performed;
- a tape expanding step of expanding the tape in such a manner that a layout of the plurality of devices adhered to the tape corresponds to a layout of the plurality of electrodes, after the transfer step is performed; and
- a die bonding step of bonding the plurality of devices adhered to the expanded tape to the plurality of electrodes at once, after the tape expanding step is performed.

2. The device transferring method according to claim 1, wherein the device is a light emitting diode.

3. The device transferring method according to claim 1, further comprising:
- a step of exposing those surfaces of the devices which make contact with the tape, before or after the tape expanding step is performed.

4. The device transferring method according to claim 1,
the tape including a pressure sensitive adhesive including an ultraviolet-curing resin,
the device transferring method further comprising:
- a step of applying ultraviolet rays to the tape to cure the pressure sensitive adhesive, after the tape expanding step is performed.

* * * * *